United States Patent [19]

Tei et al.

[11] Patent Number: 6,122,301
[45] Date of Patent: Sep. 19, 2000

[54] LASER LIGHT SOURCE APPARATUS

[75] Inventors: Daikou Tei, Seto; Naoyuki Mekada, Komaki, both of Japan

[73] Assignee: Santec Corporation, Komaki, Japan

[21] Appl. No.: 09/333,053

[22] Filed: Jun. 15, 1999

[30] Foreign Application Priority Data

Jun. 17, 1998 [JP] Japan .................................. 10-169599
Jul. 2, 1998 [JP] Japan .................................. 10-187862

[51] Int. Cl.[7] ............................. H01S 3/13; H01S 3/10; H01S 3/04
[52] U.S. Cl. ............................. 372/32; 372/20; 372/34; 372/4 R
[58] Field of Search .................................. 372/32, 34, 20

[56] References Cited

U.S. PATENT DOCUMENTS

| 4,815,081 | 3/1989 | Mahlein et al. | 372/32 |
|---|---|---|---|
| 5,438,579 | 8/1995 | Eda et al. | 372/34 |

FOREIGN PATENT DOCUMENTS

| 62-119993 | 6/1987 | Japan . |
| 63-181389 | 7/1988 | Japan . |
| 4-029387 | 1/1992 | Japan . |
| 4-157780 | 5/1992 | Japan . |
| 4-126201 | 11/1992 | Japan . |
| 4-349678 | 12/1992 | Japan . |
| 6-281812 | 10/1994 | Japan . |

OTHER PUBLICATIONS

H. Ishii et al., "Quasicontinuous Wavelength Tuning in Super–Structure–Grating (SSG) DBR Lasers", IEEE Journal of Quantum Electronics, vol. 32, No. 3, Mar. 1996, pp. 433–441.

*Primary Examiner*—Frank G. Font
*Assistant Examiner*—Armando Rodriguez
*Attorney, Agent, or Firm*—McDermott, Will & Emery

[57] ABSTRACT

A wavelength locker 4 is provided at one light beam exit end of a laser diode 1. The wavelength locker 4 incorporates an interference optical filter 3, and photo diodes PD1, PD2 for detecting its transmitted light and reflected light. A thermistor 15 and a temperature detector 14 for detecting the temperature of the interference optical filter 3 are provided. Calculating the output ratio of the photo diodes PD1, PD2, the wavelength is controlled so that the correction value by the temperature of the output ratio may be a specified value. The laser diode 1 and wavelength locker 4 are sealed in an optical module 11, and mounted on a substrate together with other blocks. Thus is obtained a laser light source apparatus composed in a simple and small constitution within a emission possible wavelength range of laser light source and capable of emitting stably.

11 Claims, 12 Drawing Sheets

F I G. 4(a)
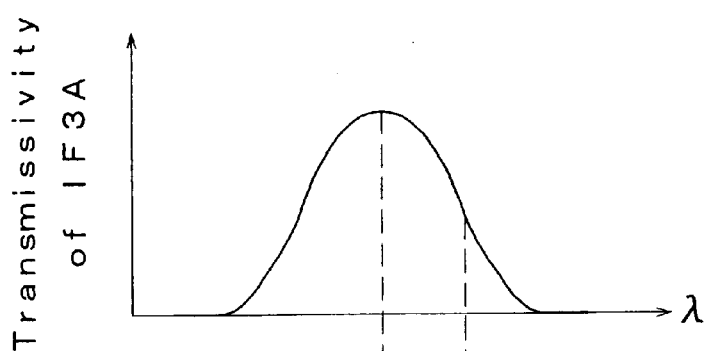
F I G. 4(b)
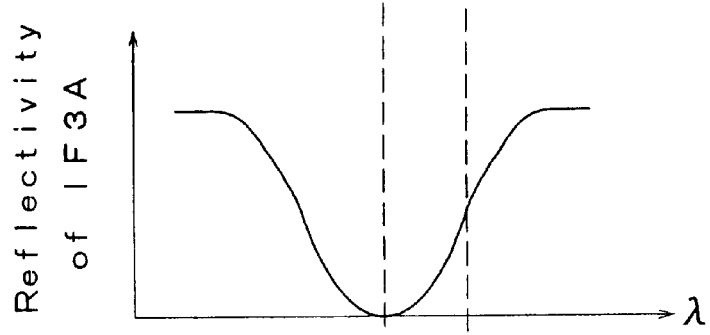
F I G. 4(c)
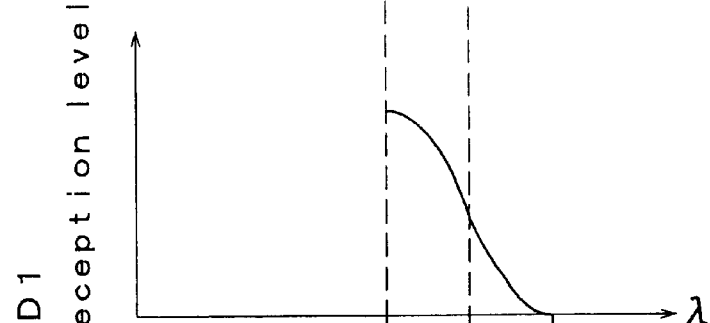
F I G. 4(d)
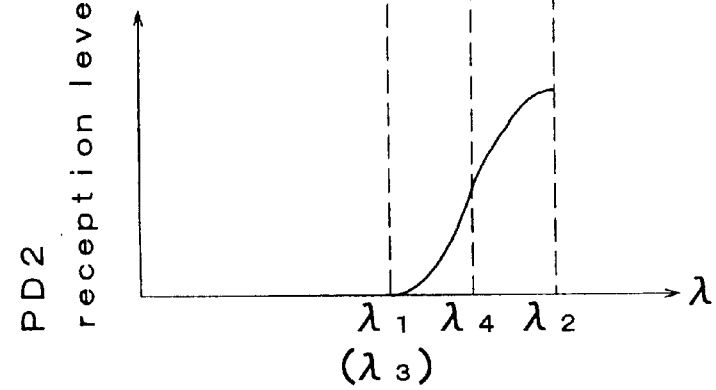

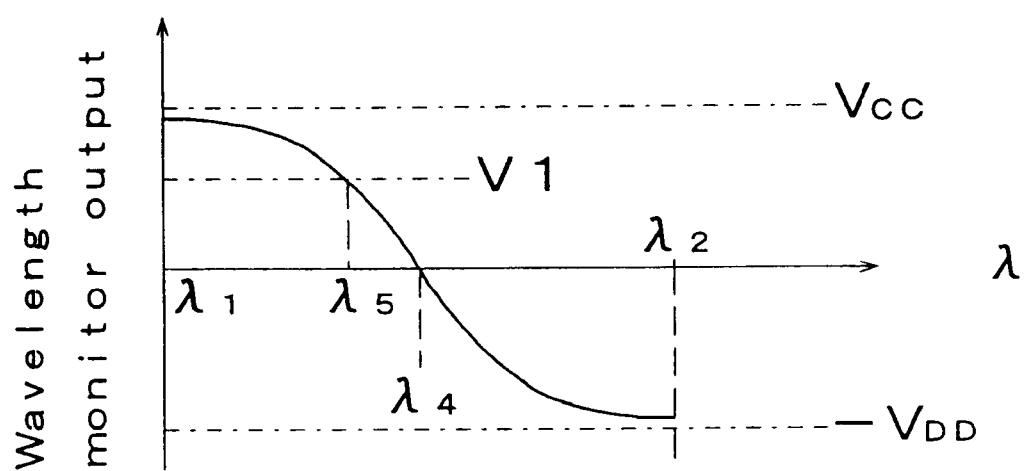
F I G. 6

F I G. 8(a)
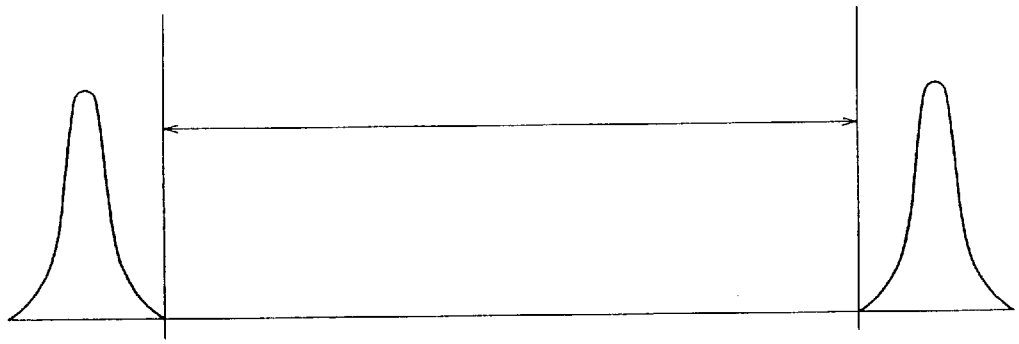
F I G. 8(b)
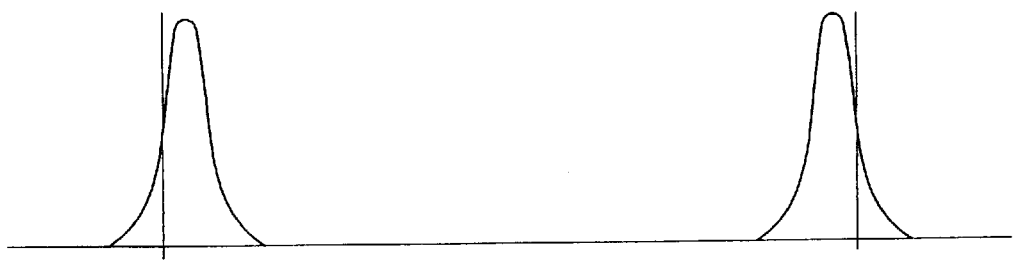
F I G. 8(c)
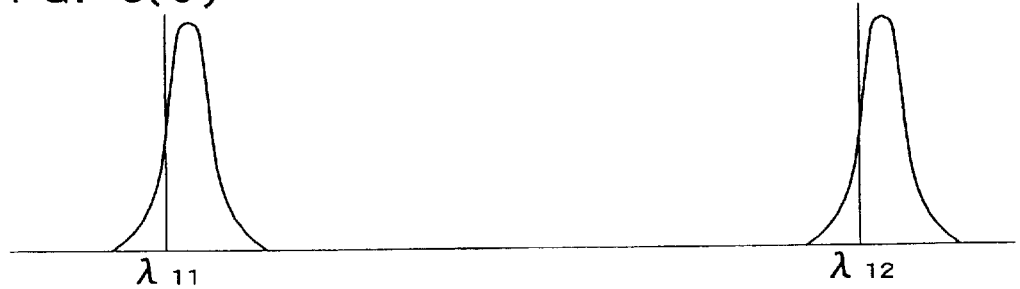
$\lambda_{11}$         $\lambda_{12}$

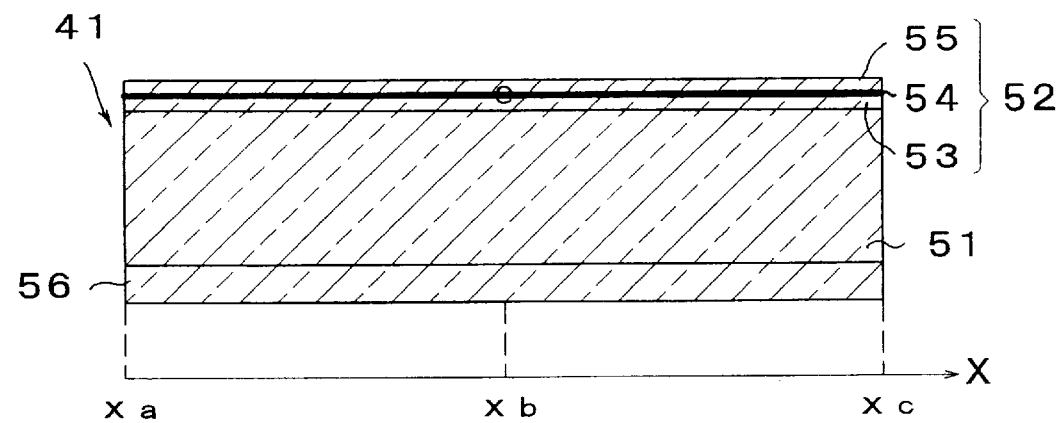
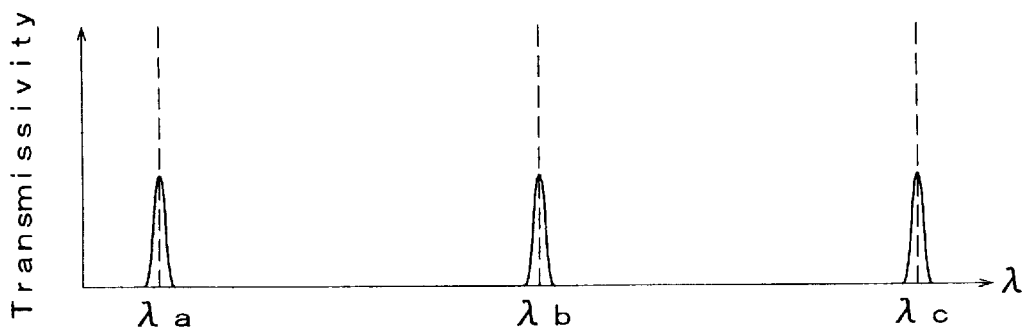
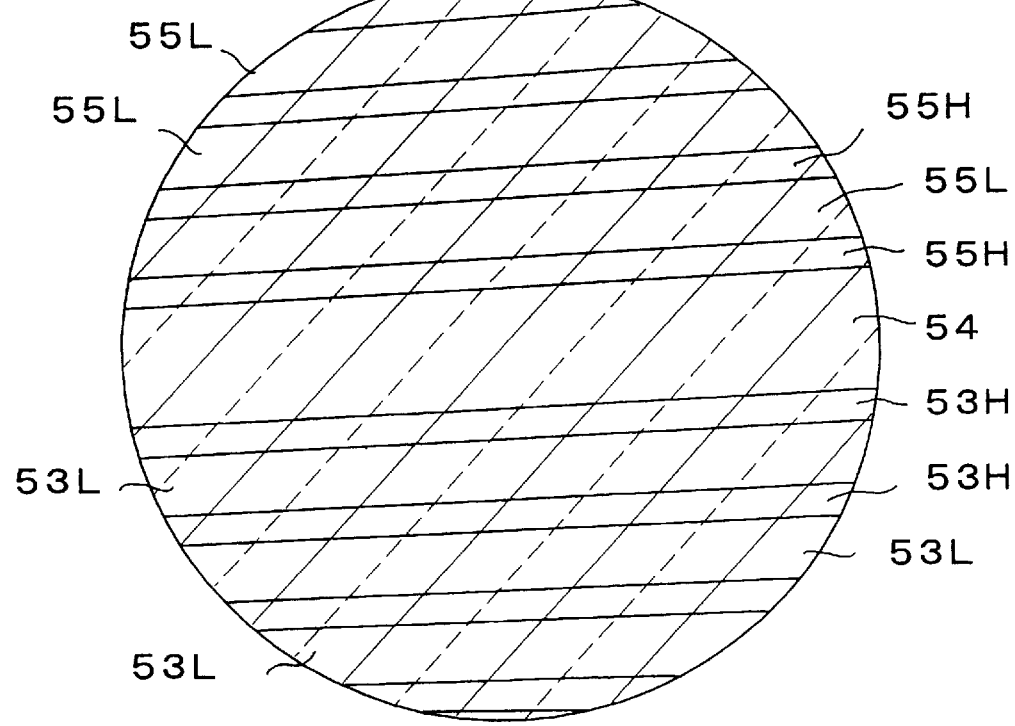

LASER LIGHT SOURCE APPARATUS

FIELD OF THE INVENTION

The present invention relates to a semiconductor laser light source apparatus capable of controlling the wavelength used in optical communication, optical information processing, optical measurement, and the like.

PRIOR ART

In optical communication, at the present, by multiplexing lights of multiple wavelengths in an optical fiber and transmitting, a wavelength division multiplex communication system is being studied in order to increase the quantity of transmission substantially as compared with the case of using light of single wavelength. To realize the wavelength division multiplex communication, the wavelength of the laser light source must be stabilized sufficiently in order to transmit laser lights of multiple wavelengths within a relatively narrow wavelength band capable of amplifying the optical signal directly, for example, at an interval of 0.4 nm or less. Moreover, in optical information processing or optical measurement, the stabilization of wavelength of the laser light source is an important subject for enhancing the density of information and improving the precision of measurement.

To stabilize the emission wavelength of the laser light source, for example, using an element having a reference wavelength characteristic by some way or other, an error from the emission wavelength is detected, and is fed back to the laser light source. Up to now, using the atom or molecule absorption as the reference, an apparatus for stabilizing the wavelength, and methods of adjusting wavelength by modulating the wavelength of reference light or light source by dither, using holography, grating, Mach-Zehnder interferometer or Fabry-Perot interferometer have been known. Dither is to oscillate the light wavelength slightly by some way, so that the difference from the reference wavelength and direction may be distinguished. By feeding back the distinguishing result to the laser light source, the emission wavelength is stabilized. It is also known to stabilize the emission wavelength of laser light source by using multilayer interference optical filter or an etalon as reference wavelength.

In such conventional methods, however, the light of the light source such as a laser diode is modulated by changing the emission wavelength by giving a delicate change to the light source by the dither, judging the wavelength changing direction electrically, and detecting the difference from the reference to feed back to the light source. It is hence possible to overlap with the modulation signal as information. To eliminate such effects of the dither, a low pass filter or an electric filter is indispensable. Besides, the control system is complicated because of the dither, and if the dither is accompanied by movable parts, the reliability is low and the life is shortened.

Japanese Laid-open Patent No. 4-157780 discloses an art in which laser light is entered in a Fabry-Perot etalon, its transmitted light P1 and reflected light P2 are received by first and second photo detectors, their outputs are put into a subtractor, and the oscillation is controlled so that the two outputs may coincide with each other. The oscillation frequency is adjusted by changing the etalon angle, temperature control, electric field control, or etalon pushing pressure, so that the oscillation frequency of the semiconductor laser is stabilized. Japanese Laid-open Patent No. 62-119993 discloses an art in which the reflection from a laser diode is entered in a dichroic mirror, its reflected light and transmitted light are received by photo detectors, the output is controlled so that the sum of these outputs may be constant, and the wavelength is controlled so that the ratio may be constant. Japanese Laid-open Patent No. 4-349678 discloses an art in which the light of a semiconductor laser is put into a filter, its reflected light and transmitted light are received by photo diodes, and the wavelength is controlled by wavelength comparison unit.

In these prior arts, however, the emission wavelength of the laser light source can be hardly controlled. Besides, unless the temperature of the etalon and others is controlled, the characteristics vary significantly depending on the temperature, and the wavelength is not stabilized.

SUMMARY OF THE INVENTION

The invention is devised in the light of the problems of such prior arts, and it is hence an object thereof to present a semiconductor laser light source apparatus composed in an extremely simple structure and in a small size, without using dither, photo coupler, etalon or the like, and capable of emitting laser light of a desired wavelength accurately.

According to the invention, by emitting the laser light source, its laser light is entered in an optical filter. The incidence to the optical filter includes the incidence by focusing through a lens, but it is intended to enter through the space without using optical fiber or the like. This filter passes light of a specific wavelength and reflects other light, and the transmitted light and reflected light are detected by first and second photo detectors respectively, and their output ratio is calculated in an output ratio calculator. In order that the output ratio may be a specified value, the oscillation wavelength of the laser light source is controlled. By detecting the temperature of the optical filter and compensating for characteristic changes due to temperature changes, a laser light of specified wavelength can be emitted. Such optical filter can be composed as an interference optical filter of multilayer films, and using the interference optical filter of wavelength variable type composed so as to change the transmission wavelength continuously in a specific direction, by changing the incident position, the emission wavelength of laser light source can be changed.

BRIEF DESCRIPTION OF THE DRAWINGS

FIG. 4(*a*) through FIG. 4(*d*) are graphs showing characteristic changes of one of a band pass filter and photo diodes PD1 and PD2 in relation to the emission wavelength of the laser light source.

FIG. 6 is a graph showing changes of error signal in relation to the emission wavelength of the laser light source.

FIG. 8(a) through FIG. 8(c) are graphs showing wavelength characteristic of an interference optical filter in the second embodiment.

FIG. 9(a) is a sectional view showing a constitution of an interference optical filter in single cavity structure in the second embodiment of the invention, FIG. 9(b) is a graph showing changes of transmissivity on its X-axis, and FIG. 9(c) is a magnified sectional view of circular portion of FIG. 9(a).

DESCRIPTION OF THE PREFERRED EMBODIMENTS

Figure 1:
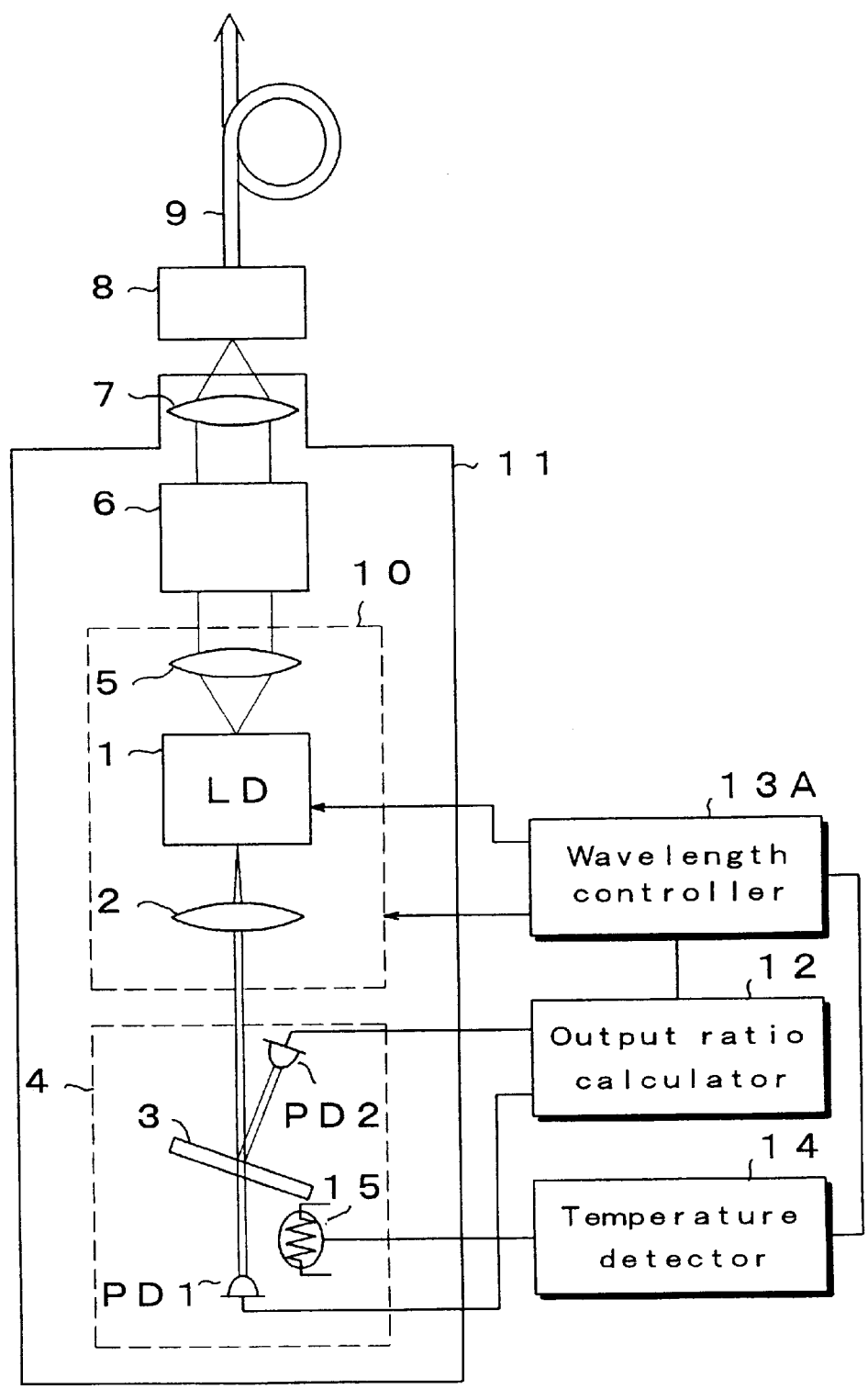
FIG. 1 is a block diagram showing an entire constitution of a laser light source apparatus in a first embodiment of the invention.

FIG. 1 is a diagram showing a wavelength variable type laser light source apparatus according to a first embodiment of the invention. As shown in the diagram, this embodiment employs a semiconductor laser, namely a laser diode 1 of a nearly constant emission wavelength, for example, a semiconductor laser of distribution feedback type or the like. In the distribution feedback type semiconductor laser, by changing the ambient temperature or changing the driving current, the emission wavelength can be varied in a range of several nanometers. The laser diode 1 emits laser lights to both sides of a chip. Therefore, the laser light emitted downward in the diagram is used for monitor. Herein, the laser light is entered in an interference optical filter 3 through a lens 2. The interference optical filter 3 is a band pass type optical filter in which nearly one end of the emission possible range of the laser light source is the transmission wavelength. A first photo detector, e.g. a photo diode PD1, is disposed at a position for receiving the transmitted light. A second photo detector, e.g. a photo diode PD2 is disposed at a position for receiving the light reflected by the interference optical filter 3. The interference optical filter 3 and photo diodes PD1, PD2 are used as a wavelength locker 4 for monitoring the wavelength and fixing the wavelength.

On the other hand, at the other exit side of the laser diode 1, an isolator 6 is disposed through a lens 5. The isolator 6 is to define the light transmission direction, and its exit light is connected to an optical fiber 9 through a lens 7 and a collimator 8. The optical fiber 9 guides the emitted laser light to a desired position. Herein, the laser diode 1, and lenses 2 and 5 are disposed in a temperature adjusting module 10 capable of controlling the temperature by a using temperature control element such as Peltier element. The wavelength locker 4, temperature adjusting module 10, isolator 6 and lens 7 are incorporated in an airtight optical module 11. Outside of this optical module 11, an electronic circuit is provided in order to control temperature according to the outputs from the photo diodes PD1 and PD2.

The interference optical filter 3 can be a multi-layer optical interference filter laminating alternately high refractive index films and low refractive index films having the optical film thickness of a quarter of transmission wavelength $\lambda$. The refractive index of the high refractive index films is relatively higher than that of the low refractive index films. Moreover, by installing a cavity layer in an optical film thickness of half wavelength between the high and low refractive index films, the optical band pass filter characteristic for transmitting light of a specific wavelength is composed. The wavelength characteristic of the interference optical filter 3 is that the transmissivity and reflectivity change continuously is a predetermined direction with the range of the emission possible wavelength of the laser diode 1.

The electronic circuit of the laser light source apparatus is described below. A wavelength controller comprises an output ratio calculator 12, a wavelength controller 13A, and a temperature detector 14. The output ratio calculator 12 calculates the output ratio of photo diodes PD1, PD2 which are first and second photo detectors, and its output is given to the wavelength controller 13A. The wavelength controller 13A controls the emission wavelength of the laser light source so that the output ratio by the output ratio calculator 12 may be a specified value. The emission wavelength of the laser diode 1 is adjusted by changing the driving current to be supplied into the electrode, or changing the ambient temperature. Near the interference optical filter 3, a temperature detecting element, for example, a thermistor 15 is provided. The output of the thermistor 15 is given to the temperature detector 14 as shown in FIG. 1. The temperature detector 14 detects the ambient temperature of the interference optical filter 3 on the basis of the signal from the thermistor 15, and its output is entered in the wavelength controller 13A.

Figure 2:
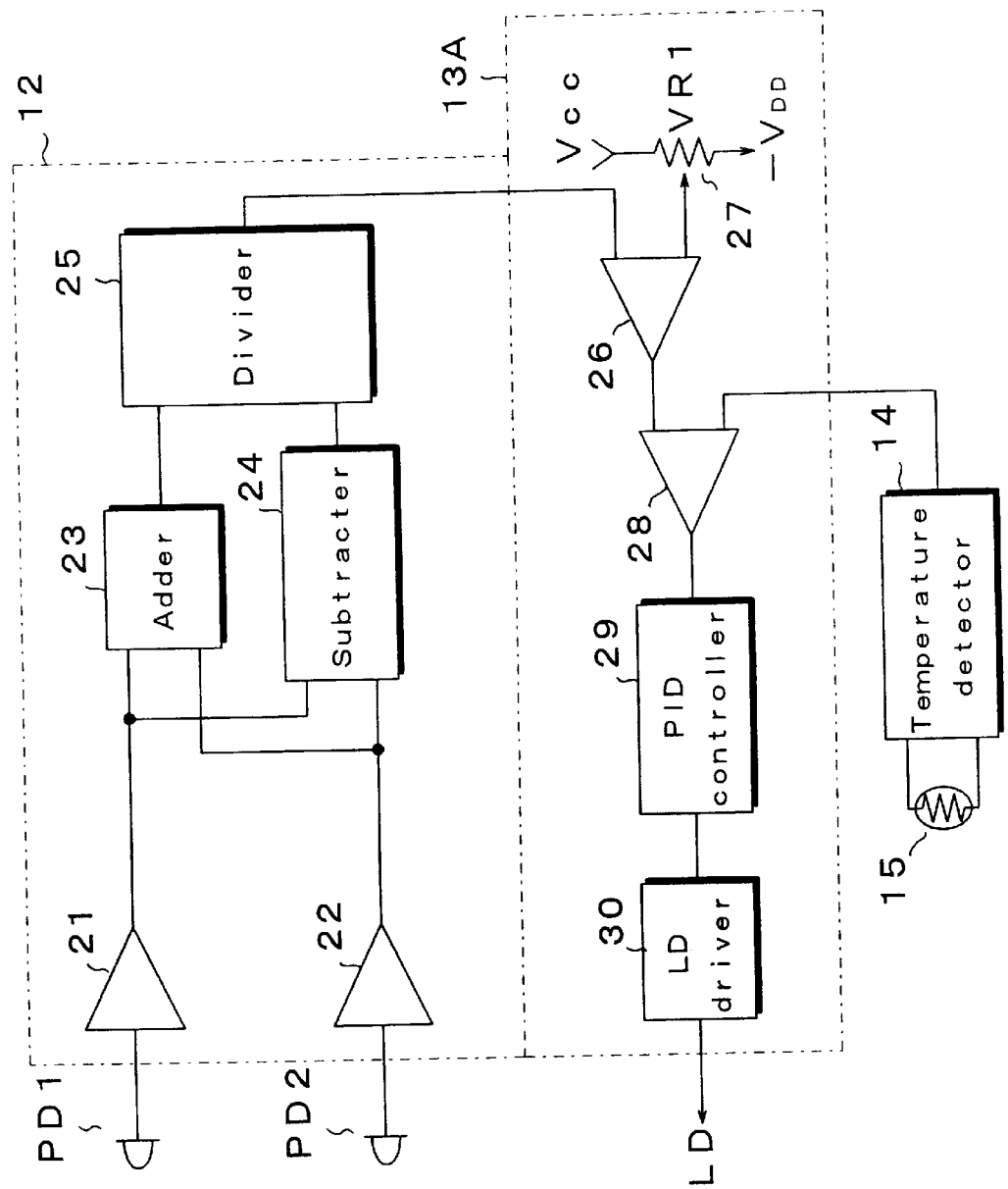
FIG. 2 is a block diagram showing a constitution of an output ratio calculator, a temperature detector and a wavelength controller of the laser light source apparatus in the first embodiment of the invention.

Examples of the output ratio calculator 12 and wavelength controller 13A are further specifically described by referring to FIG. 2. The output signals from the first and second photo diodes PD1, PD2 are given to I/V converters 21 and 22 in the output ratio calculator 12, and converted into voltage signals. The output signals of the I/V converters 21 and 22 are given to an adder 23 and a subtracter 24, respectively and the outputs of the adder 23 and subtracter 24 are given to a divider 25. The divider 25 normalizes the light received in the photo diodes PD1, PD2, and detects the wavelength of the incident light on the basis of their output ratio. Herein, the I/V converters 21, 22, the adder 13, the subtracter 24, and the divider 25 compose the output ratio calculator 12 for detecting the wavelength of laser light by the output ratio of the first and second photo detectors, and its output is given to one end of an error detector 26. A reference voltage is given to the other input end of the error detector 26. This reference voltage is designed to be adjusted in a range of $+V_{cc}$ to $-V_{DD}$ by a reference value adjuster 27, for example, a variable resistor VR1. The error detector 26 detects the difference between this reference voltage and input voltage as an error signal, and gives the error signal to an adder 28. The adder 28 adds the output of the error detector 26 and the temperature detection signal, and compensates for characteristic changes on the basis of the temperature change of the interference optical filter 3, and thereby changes its target value. The adder 28, temperature detector 14, and thermistor 15 compose a temperature compensator for compensating for characteristic changes due to temperature changes of the interference optical filter 3.

The output of the adder 28 is given to a PID controller 29. The PID controller 29 is responsible for PID control so that the error signal may be 0, and its output is fed back to the laser diode 1 through a semiconductor laser driver 30. The semiconductor laser driver 30 controls the emission wavelength of the laser diode 1 so as to change within a range of, for example, several nanometers or less by controlling the driving current of the electrode of the laser diode 1 and the temperature of the laser diode 1 in the temperature control module 10. Herein, the error detector 26, variable resistor VR1 for giving reference voltage to the error detector 26, adder 28, PID controller 29, and semiconductor laser driver 30 compose the wavelength controller 13A for controlling the emission wavelength of the laser light source so that the output ratio by the output ratio calculator 12 may be a specified value.

Figure 3A:
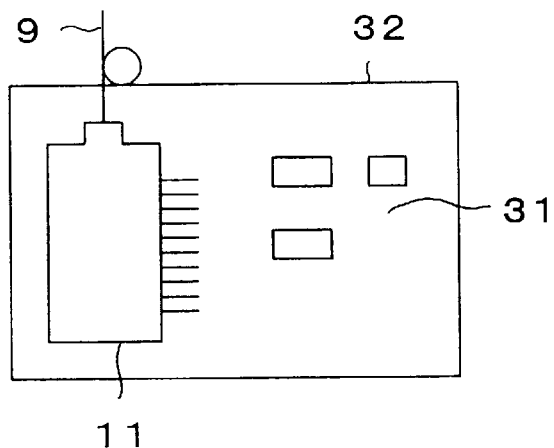
FIG. 3(*a*) is a top view of an overall structure disposed on a printed circuit board, and FIG. 3(*b*) is a perspective view showing the appearance of the laser light source apparatus of the first embodiment.

FIG. 3(a) is an overall structural diagram of this laser light source apparatus. In this embodiment, the optical module 11 and electronic components 31 comprising the output ratio calculator 12, wavelength controller 13A and temperature detector 14 are mounted on a single printed circuit board 32. By thus mounting all parts on the printed circuit board 32, the laser light source apparatus can be composed in an extremely small and lightweight structure.

Figure 3B:
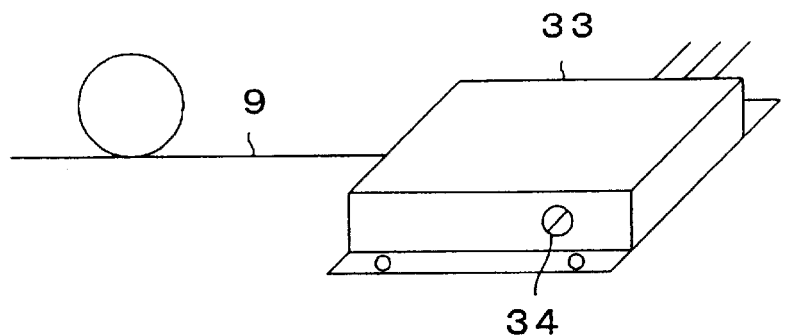

FIG. 3(b) is a perspective view showing a state of the laser light source apparatus of the embodiment accommodated in a case 33. In this embodiment, a setting knob 34 of reference voltage by variable resistor VR1 is provided, and it is constituted so as to adjust the emission wavelength from outside of the case 33.

Figure 5A:
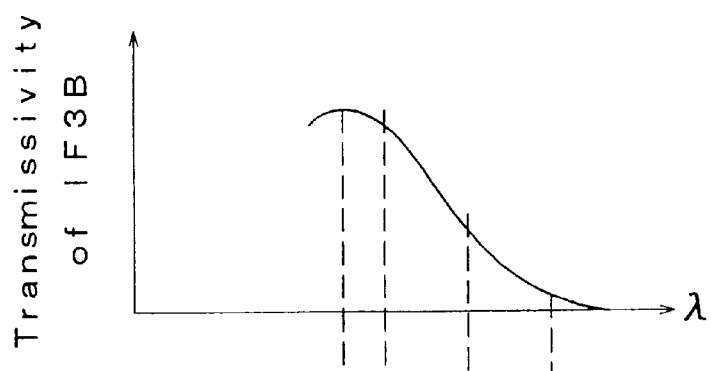
FIG. 5(*a*) through FIG. 5(*d*) are graphs showing characteristic changes of other band pass filter and the photo diodes PD1 and PD2 in relation to the emission wavelength of the laser light source.
Figure 5B:
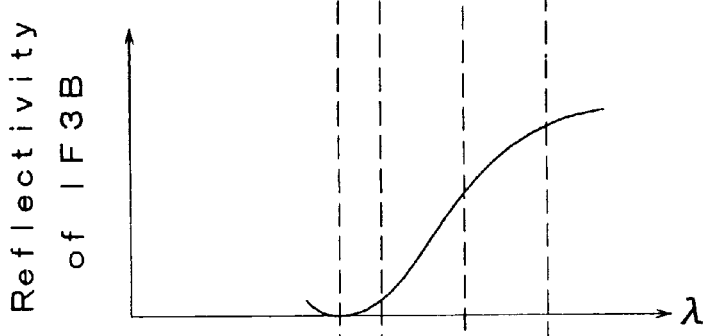
Figure 5C:
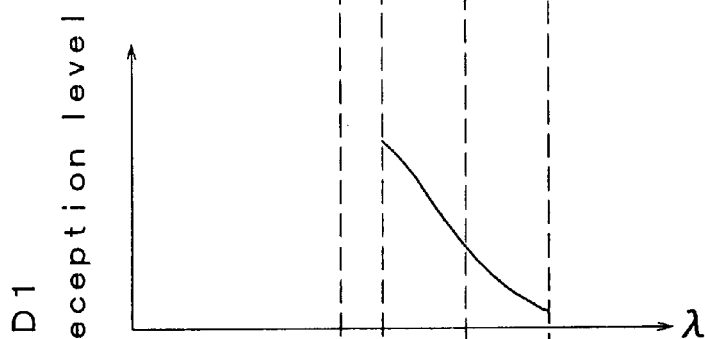
Figure 5D:
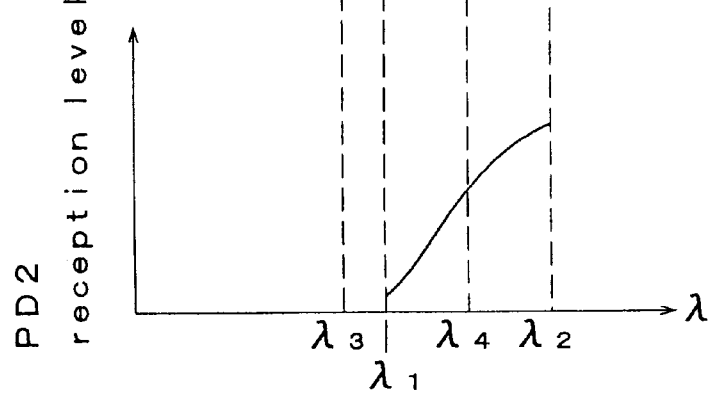

The operation of the laser light source apparatus in this embodiment is described below. FIGS. 4(a) and (b) are graphs showing the transmissivity and reflectivity of the interference optical filter 3A. Supposing the emission possible wavelength range of the laser diode 1 to be $\lambda 1$ to $\lambda 2$, the central wavelength $\lambda 3$ of the interference optical filter 3 is selected so that the reflectivity and transmissivity may vary monotonously and continuously in this range. For example, the central wavelength $\lambda 3$ is selected so as to be equal to the wavelength at one end of the emission possible wavelength, say, $\lambda 1$. Or, as shown in FIG. 5 which relates to the characteristic of other interference optical filter 3B, by setting $\lambda 3$ by deviating slightly from this emission possible range $\lambda 1$ to $\lambda 2$, the emission possible range may be included in this slope. The interference optical filters 3A, 3B have the characteristics of passing the light of this wavelength $\lambda 3$, and reflecting the other light as shown in FIG. 4(b) and FIG. 5(b). Corresponding to the emission wavelength $\lambda$ ($\lambda 1 <= \lambda <= \lambda 2$) of the laser diode 1 at this time, the optical outputs obtained in the photo diodes PD1, PD2 are respectively as shown in FIGS. 4(c), (d), and FIGS. 5(c), (d). That is, the output obtained in the photo diode PD1 corresponds to the characteristic of transmissivity of FIG. 4(a) or FIG. 5 (a). Similarly, the output obtained in the photo diode PD2 corresponds to the characteristic of reflectivity of FIG. 4 (b) or FIG. 5(b).

Supposing the I/V conversion output signals of the photo diode PD1, and PD2 to be A and B, they are added, subtracted, and divided in the adder 23, subtracter 24, and divider 25, and (A−B)/(A+B) is calculated. The level normalized by the division is as shown in FIG. 6. Thus, in a range of wavelength $\lambda 1$ to $\lambda 2$, the wavelength monitor signal changes continuously depending on the emission wavelength of the laser diode 1. Thus, detecting the differential value of the wavelength monitor signal and the reference voltage of the error detector 26 as error signal, and controlling to nullify the error signal, the wavelength of the laser diode 1 may be controlled so as to coincide with the reference voltage set in the error detector 26. For example, supposing the reference voltage to be 0 V, when the output levels of PD1, and PD2 are equal at wavelength $\lambda 4$ in emission, the error signal is 0, so that the emission wavelength of the laser diode 1 may be controlled at $\lambda 4$. By setting the reference voltage at level V1 in FIG. 6, the wavelength is locked at the shorter wavelength side of $\lambda 5$. By such adjustment of the reference voltage of the adjuster 27, the emission wavelength of the laser light source may be finely adjusted in a range of wavelengths $\lambda 1$ to $\lambda 2$ as shown in FIG. 4, FIG. 5 and FIG. 6.

According to the embodiment, the laser diode 1 is sealed in the temperature adjusting module 10, and is contained in the optical module 11 including the wavelength locker 4, and mounted all together on the printed circuit board 32, and therefore part of the exit light of the semiconductor laser can be directly guided into the interference optical filter 3. Accordingly, as compared with the case of using the optical fiber or photo coupler to split the laser light and guide into the interference optical filter, the wavelength precision can be enhanced without having to consider changes in the direction of polarization. Moreover, since these optical system parts are assembled as a module, and can be mounted on the printed circuit board together with the wavelength controller so that the entire light source can be extremely reduced in size. Further, having no movable parts in small size and light weight, a laser light source apparatus of high reliability is realized.

In this embodiment, when the temperature changes in the part of the wavelength locker 4 in the optical module 11, the characteristic of the interference optical filter 3 is changed. The characteristic of the interference optical filter 3 is shifted to the shorter wavelength side by about 0.002 nm/°C. together with temperature rise. Therefore, such characteristic change is recognized preliminarily, and the target value is changed by using the temperature detector 14 and adder 28. Thus, compensating for characteristic changes of the interference optical filter 3 on the basis of temperature changes, the wavelength can be stabilized. Therefore, regardless of temperature changes of the interference optical filter 3, laser light of desired wavelength can be emitted accurately. In this case, since the temperature of the interference optical filter 3 itself is not controlled constantly, the power consumption is substantially smaller as compared with the case of keeping the temperature constant by using temperature control device such as Peltier element or heater. Still more, since temperature controller is not used in the wavelength locker, aging effects are small, and a longer life is realized.

Although not shown in this FIG. 2, regardless of the emission wavelength, the output level from the laser diode 1 can be detected by the output from the adder 23. Therefore, by adjusting the output level from the semiconductor laser so that the output of the adder 23 may be constant, the output level of the laser diode 1 can be kept constant. Such output level monitor and output level control are widely performed in the semiconductor laser, and in this embodiment, the photo diodes PD1, PD2 may be also used as output monitor element.

Thus, according to the present invention, by using the interference optical filter, the emission wavelength of the light source is controlled by the ratio of the incident light and reflected light. Accordingly, it is not necessary to use the beam splitter which is difficult to keep constant the spectral ratio accurately as in the conventional wavelength control method, and its temperature control is not necessary. It is also unnecessary to use two filters close in the wavelength selection characteristic.

Figure 7:
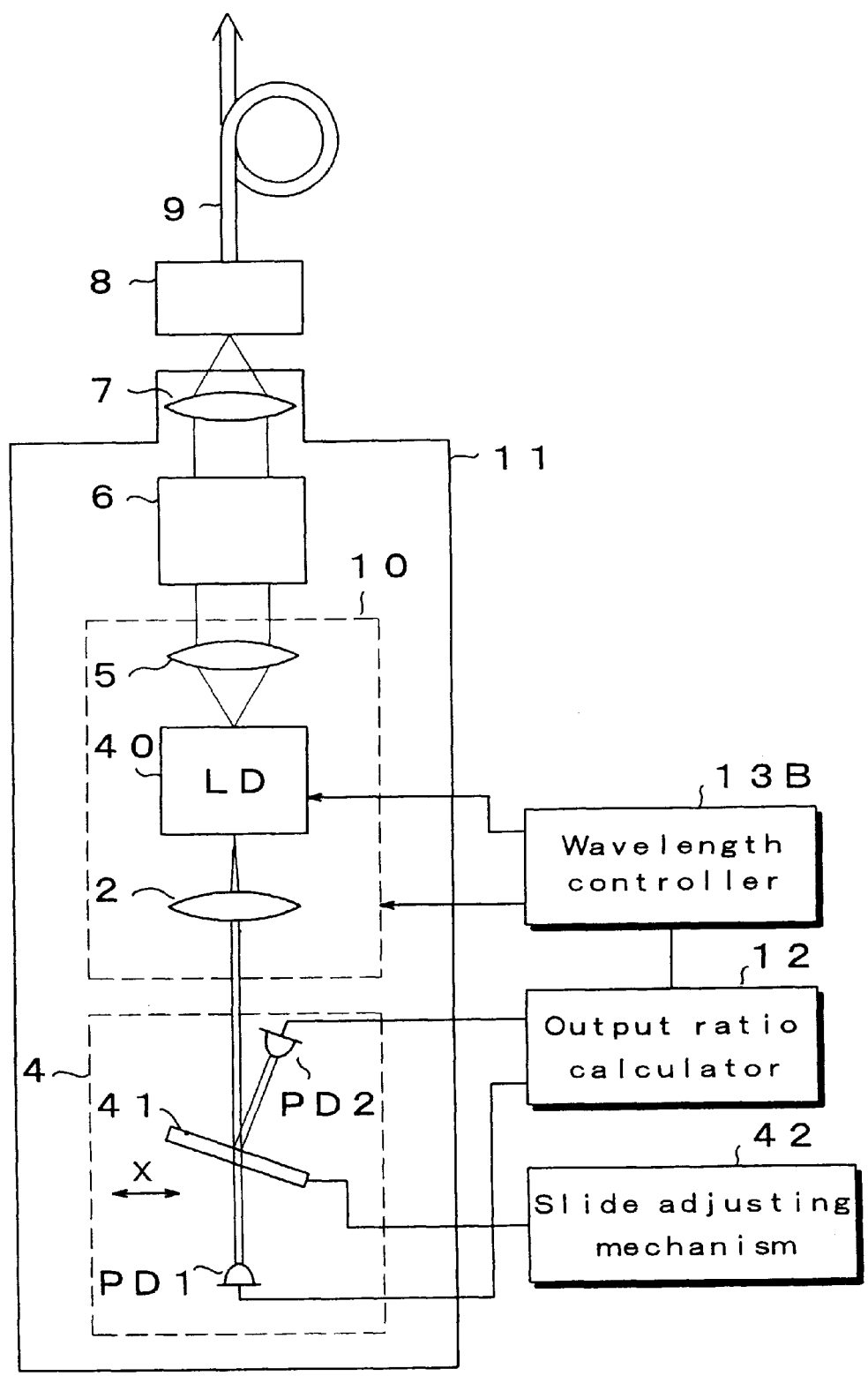
FIG. 7 is a block diagram showing an entire constitution of a laser light source apparatus in a second embodiment of the invention.

A second embodiment of the invention is described below while referring to FIG. 7. In this embodiment, a multiple-electrode type laser diode 40 is used as the laser light source. The multiple-electrode type laser diode 40 is, for example as disclosed in H. Ishii et al., IEEE Journal of Quantum Electronics, Vol.32, pp.433–44, 1996, capable of varying the emission wavelength in a wide range, for example, in a range of ±10 to 40 nm, by controlling the temperature and the current to be supplied into plural electrodes. Further, as shown in FIG. 7, as the interference optical filter in the wavelength locker 4, an interference optical filter 41 continuously changing in the transmission wavelength depending on the light incident position is used. An incident position adjusting mechanism is provided in order to change mechanically the incident position to the interference optical filter 41. The incident position adjusting mechanism may be composed, for example, as a slide adjusting mechanism 42 for sliding the interference optical filter 41 in the X-axis direction shown in FIG. 7 by rotating a screw. Thus, the incident position to the interference optical filter 41 can be changed in a specified range.

In this embodiment, supposing the wavelength variable range of the laser diode 40 to be $\lambda 11$ to $\lambda 12$, as shown in FIG. 8(*a*), in a range slightly wider than this wavelength variable range, by changing the light incident position, the transmission wavelength of the interference optical filter 41 comes to have a characteristic of changing continuously. The wavelength-transmissivity characteristic of the interference optical filter 41 at each incident position has a sufficiently narrower and steeper characteristic than the range of the emission possible wavelength ($\lambda 11$ to $\lambda 12$) as shown in FIG. 8(*a*). By varying the incident position, as shown in FIG. 8(*b*) or (*c*), the center of one slope of the wavelength-transmissivity characteristic is included in the variable range of the emission wavelength. The other constitution is same as in the first embodiment mentioned above, and the outputs of the photo diodes PD1, PD2 are given to the output ratio calculator 12, and the emission wavelength is controlled by the wavelength controller 13B.

The interference optical filter 30 is, as disclosed in U.S. Pat. No. 4,957,371, issued to Pellicori et al., designed to change continuously the optical thickness of the passing wavelength, by alternately laminating high refractive index films and low refractive index films. The interference optical filter 41 used in the embodiment is explained by referring to FIG. 9. The interference optical filter 41 is composed by evaporating multiple layers of substance on a substrate 51 of glass, silicon, etc. The substrate 51 is made of a material high in transmittance of light in a range of practical wavelength, and dielectric or semiconductor is used. In this embodiment, quartz glass is used. On the substrate 51, a multi-layer film 52 of vapor deposition substance, such as dielectric, semiconductor or others high in light transmittance in the practical wavelength range is evaporated. The multi-layer film 52 is composed of, as shown in the diagram, a lower layer 53, a cavity layer 54, and an upper layer 55. On the bottom surface of the substrate 51, an anti-reflection film 56 is formed by evaporation.

Herein, substances used as vapor deposition materials for the multi-layer film 52 and anti-reflection film 56 are, for example, $SiO_2$ (refractive index n=1.46), $Ta_2O_5$ (n=2.15), Si (n=3.46), $Al_2O_3$, $Si_2N_4$, MgF, and so on. In this embodiment, the multi-layer films 53 and 55 are formed by laminating and evaporating low refractive index films and high refractive index films alternately. Herein, the relation of film thickness d, transmission wavelength $\lambda$, and refractive index n is defined as follows.

$$\lambda = 4nd \tag{1}$$

That is, the optical thickness nd of each layer is $\lambda/4$. By alternately laminating low refractive index films and high refractive index films, the full width at half maximum (FWHM) of peak of transmittance is decreased. The relation of film thickness $d_c$ of cavity layer 54, transmission wavelength $\lambda$, and refractive index n is defined as follows.

$$\lambda = 2nd_c \tag{2}$$

That is, the optical thickness $nd_c$ of the cavity layer 54 is $\lambda/2$.

Since the interference optical filter 41 of the embodiment has the relation of the transmission wavelength and film thickness as defined in formulas (1) and (2), the substrate 51 is a slender plate, the refractive indexes of the multi-layer film 52 are constant, and the film thickness is changed continuously, so that the transmission wavelength $\lambda$ may vary. The transmission wavelength of this wavelength variable type interference optical filter 41 is $\lambda_a$ to $\lambda_c$ ($\lambda_a < \lambda_c$), and the transmission wavelength at the middle point ($x=x_b$) is $\lambda_b$. The upper and lower multi-layer films 53, 55 are composed by alternately laminating respectively a first vapor deposition substance films of a first refractive index $n_1$ and a second vapor deposition substance films of a second refractive index $n_2$ lower than the refractive index ni. That is, as the circular portion in FIG. 9(*a*) is magnified in FIG. 9(*c*), each film thickness is changed continuously. In FIG. 9(*c*), the low refractive index films of the lower multi-layer film 53 are supposed to be 53L and high refractive index films to be 53H, and the low refractive index films of the upper multi-layer film 55 are supposed to be 55L and high refractive index films to be 55H. For the transmission wavelength $\lambda_a$ of the end portion $x_a$ on the x-axis of the filter in FIG. 9(*a*), it is set to establish the formulas (1) and (2) in the low refractive index films and high refractive index films, respectively. Similarly, for the transmission wavelengths $\lambda_b$, $\lambda_c$ at positions $x_b$, $x_c$ on the substrate 51, the film thickness is set so as to establish the formulas (1) and (2) at the wavelengths $\lambda_b$, $\lambda_c$. Therefore, each film thickness of the layer changes continuously from position $x_a$ to $x_c$ on the x-axis as shown in the diagram, and the film thickness increases toward the positive direction of the x-axis.

Such continuous change of film thickness is realized by disposing the substrate obliquely so as to change continuously the interval to the evaporation source, when evaporating and forming the multi-layer film 52 on the substrate 51.

Instead of changing continuously the film thicknesses of the interference optical filter 41, while keeping the film thicknesses constant, the refractive indexes $n_1$, $n_2$ of the multi-layer film 52 may be changed continuously in the X-axis direction, so that the optical thicknesses may be varied continuously.

Thus constituted interference optical filter 41 has a light transmission characteristic in a narrow band. Accordingly, by moving the light incident position in the interference optical filter 41 mechanically in the X-axis direction by using the slide adjusting mechanism 42, the transmitted wavelength can be changed continuously. In this way, since the wavelength of the incident light into the photo diodes PD1, PD2 is varied by the slide adjusting mechanism 42, the locking wavelength can be changed.

Incidentally, as shown in FIG. 8(*b*), this wavelength variable range changes so that the point having the 1/2 characteristic of the transmissivity characteristic of the longer wavelength side than the peak shown in FIG. 8(*b*) may change at least in a range of $\lambda 11$ to $\lambda 12$ of the laser light source apparatus. Or, as shown in FIG. 8(*c*), it may be also changed so that the point having the 1/2characteristic of the transmissivity characteristic of the shorter wavelength side than the peak may change at least in a range of λ11 to λ12 of the laser light source apparatus.

Figure 10:
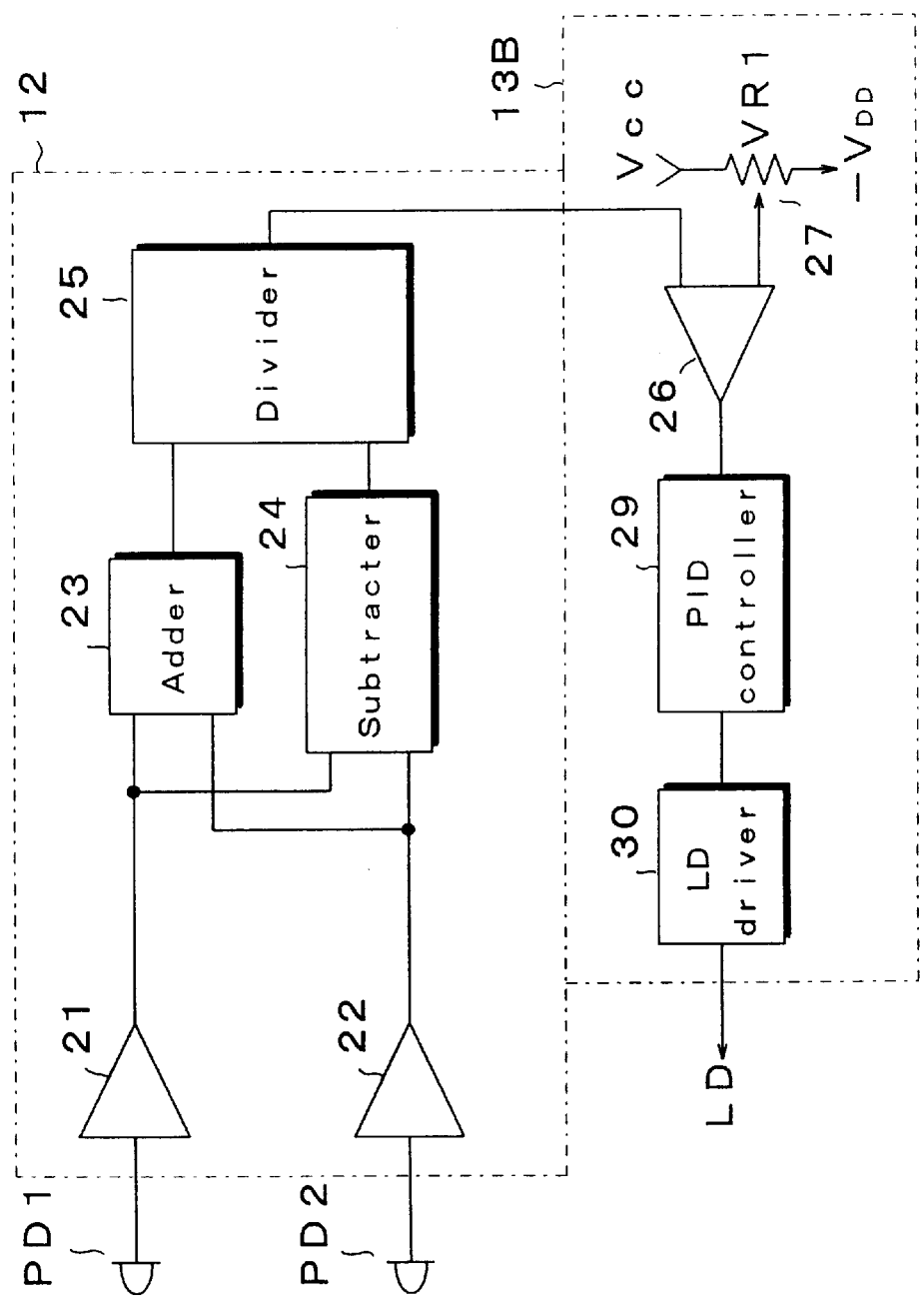
FIG. 10 is a block diagram showing a constitution of an output ratio calculator and a wavelength controller in a laser light source apparatus in the second embodiment of the invention.

Examples of the output ratio calculator 12 and wavelength controller 13B are further specifically described by referring to FIG. 10. The output ratio calculator 12 is the same as the first embodiment and its output is given to one end of the error detector 26. A reference voltage is given to the other input end of the error detector 26. This reference voltage is designed to be adjusted in a range of $+V_{cc}$ to $-V_{DD}$ by the reference value adjuster 27, for example, a variable resistor VR1. The error detector 26 detects the difference between this reference voltage and input voltage as an error signal, and gives the error signal to the PID controller 29. The PID controller 29 is responsible for PID control so that the error signal may be 0, and its output is fed back to the laser diode 40 through a laser diode driver 30. The laser diode driver 30 controls the current flowing in the laser diode 40, or the temperature of the laser diode 30, and controls to change the emission wavelength of the laser diode 40 in a range of, for example, ±40 nm or less. Herein, the error detector 26, the variable resistor VR1, the PID controller 29, and the laser diode driver 30 compose the wavelength controller 13B for controlling the emission wavelength of the laser light source so that the output ratio by the output ratio calculator 12 may be a specified value.

Figure 11A:
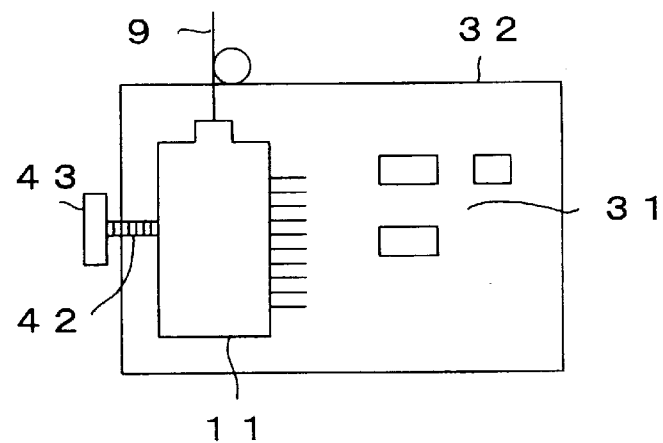
FIG. 11(a) is a top view of an overrall structure disposed on a printed circuit board.

FIG. 11 is a perspective view showing an overall constitution of the wavelength variable type laser light source apparatus according to the embodiment. In this embodiment, same in the first embodiment, the optical modules 11 and electronic circuits 31 are mounted on the printed circuit board 32, and are accommodated in the case 33. By disposing a knob 43, it is constituted to change the incident position of the interference filter 41 from outside of the case. Further, a knob 34 for setting the reference voltage by the variable resistor VR1 is provided at the same time. The other constitution is the same as in the first embodiment.

The operation of this second embodiment is described below. In this embodiment, in order to change largely the emission wavelength of the laser light source, by rotating the adjusting knob 43 of the slide adjusting mechanism 42, the incident position of the incident light to the interference light filter 41 is changed, so that the transmission wavelength λ of the interference optical filter 41 shown in FIG. 8 may be changed. Thus, the emission possible wavelength can be changed largely. Therefore, by adjusting the emission wavelength roughly by the incident position to the interference optical filter 41, and adjusting the wavelength finely by varying the reference voltage of the reference value adjuster 27, the user can set at a desired wavelength. In the invention, therefore, using one interference optical filter, the wavelength can be controlled accurately without using beam splitter.

In this embodiment, the transmission wavelength is various continuously in the longitudinal direction of the interference optical filter 41, but by using a circular interference optical filter, the interference optical filter may be composed so that the transmission wavelength may change continuously in the radial direction. In this case, as the incident position adjusting unit, instead of the slide adjusting mechanism, a rotary mechanism may be provided for rotating along the axial direction of the interference optical filter, so that the transmission wavelength may be varied.

Figure 11B:
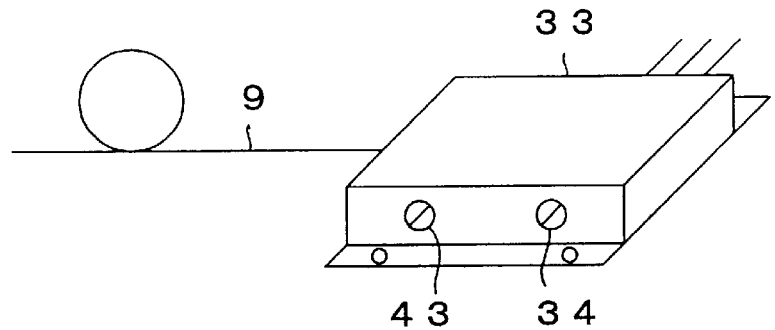
FIG. 11(b) is a perspective view showing the appearance of the laser light source apparatus of the second embodiment.

In the second embodiment, it is designed to adjust the knobs 43, 34 of the slide adjusting mechanism 42 and variable resistor VR1 from outside of the case as shown in FIG. 11(b), but it may be also designed to change the wavelength by the knob 43 of the slide adjusting mechanism 42 only, without using reference voltage adjuster by variable resistor VR1.

Figure 12:
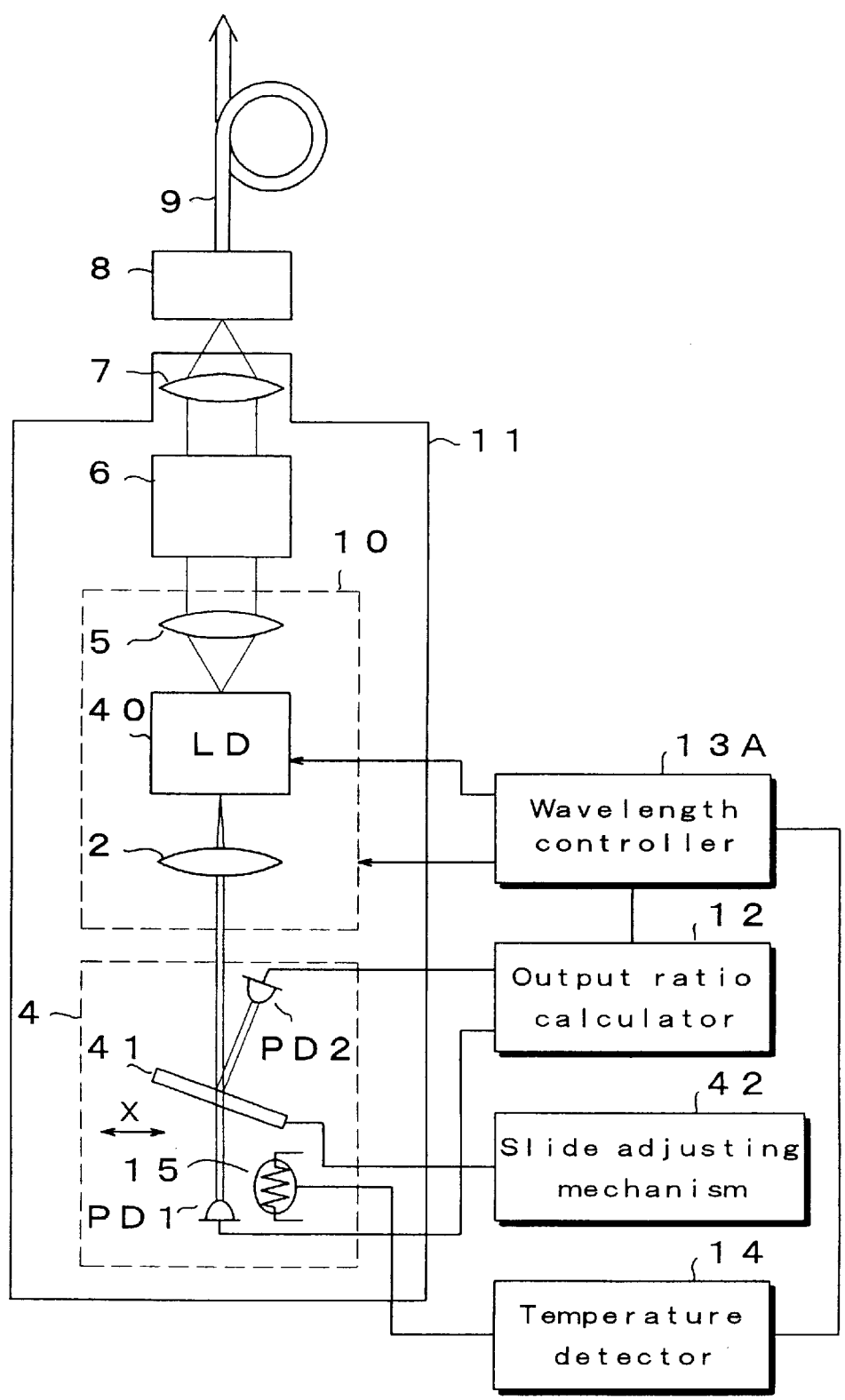
FIG. 12 is a block diagram showing an entire constitution of a laser light source apparatus in a third embodiment of the invention.

A third embodiment of the invention is described while referring to FIG. 12. In this embodiment, same as in the second embodiment, the wavelength variable type laser diode 40 is used as light source, and the incident light of the interference light is changed continuously by the slide adjusting mechanism 42, while the ambient temperature of the interference optical filter 41 is detected, and it is designed to compensate for characteristic changes due to temperature variations. Accordingly, same as in the first embodiment, a thermistor 15 is disposed near the interference optical filter 41, and the output of the thermistor 15 is put into the temperature detector 14. The output of the temperature detector 14 is given to the wavelength controller 13A. The constitution of the wavelength controller 13A is same as in the first embodiment. In this case, the wavelength is controlled accurately in a wide range, and the output of the error detector 26 is varied to cancel the characteristic changes due to temperature changes of the interference optical filter 41, so that a light source of an accurate emission wavelength may be obtained over a wide range of temperatures.

In the foregoing first to third embodiments, as the signal processing circuits, the adder, subtractor and divider for calculating their output ratio are provided, but the ratio of two I/V converters may be calculated directly. Alternatively, the ratio of the sum to one of the outputs from the photo diodes may be calculated to be obtained as a wavelength monitor signal. Further, the output ratio calculator and wavelength controller may be realized by using a microcomputer.

What we claim is:

1. A laser light source apparatus comprising:

a semiconductor laser;

an optical filter having a specific wavelength characteristic within the emitting range of said semiconductor laser for receiving light of said semiconductor laser through space, transmitting part of the incident light and reflecting the other light;

a first photo detector for detecting the transmitted light from said optical filter;

a second photo detector for detecting reflected light from said optical filter;

an output ratio calculator which calculates the output ratio of said first and second photo detectors;

a wavelength controller which controls the emission wavelength of said semiconductor laser in a manner that the output ratio by said output ratio calculator becomes a specified value;

an optical module which accommodates said semiconductor laser, optical filter, and first and second photo detectors;

a temperature detecting element disposed near said optical filter, for detecting the ambient temperature of said optical filter; and a temperature compensator which compensates for characteristic changes due to temperature changes of the optical filter on the basis of the output of the temperature detecting element by correcting the target value of the output ratio issued from said output ratio calculator;

wherein electronic circuits composing said output ratio calculator and wavelength calculator and the optical module are accommodated in a same case.

2. A laser light source apparatus according to claim 1, wherein said optical filter is composed of an interference optical filter laminating low refractive index films and high refractive index films having optical thicknesses of $\lambda/4$ for transmission wavelength $\lambda$ on a substrate alternately in multiple layers.

3. A laser light source apparatus of claim 1, wherein said optical filter is set so that the slope region in which the transmission characteristics change monotonously and continuously is included in the wavelength variable range of said semiconductor laser.

4. A laser light source apparatus according to claim 1, wherein said output ratio calculator comprises:

an adder for calculating the sum of the output signals of said first and second photo detectors;

a subtracter for calculating the difference of the output signals of said first and second photo detectors; and a divider for calculating the output ratio of said adder and said subtracter.

5. A laser light source apparatus according to claim 1, wherein said wavelength controller comprises:

an error detector for detecting the difference of the output ratio calculated by said output ratio calculator and the specified reference value;

a reference value adjuster for setting reference value in said error detector; and a light source driver for controlling the emission wavelength of said semiconductor laser in a manner that the error detected by said error detector and compensated by said temperature compensator becomes zero.

6. A laser light source apparatus according to claim 5, wherein said reference value adjuster generates a reference value in a specified range.

7. A laser light source apparatus comprising:

a variable wavelength type semiconductor laser capable of changing the wavelength of light continuously;

an interference optical filter for receiving light of said semiconductor laser through space, transmitting part of the incident light and reflecting the other light;

a first photo detector for detecting the transmitted light from said interference optical filter;

a second photo detector for detecting the reflected light from said interference optical filter;

an output ratio calculator which calculates the output ratio of said first and second photo detectors;

a wavelength controller which controls the emission wavelength of said semiconductor laser so that the output ratio by said output ratio calculator becomes a specified value;

an optical module which accommodates said semiconductor laser, optical filter, and first and second photo detectors; and an incident position adjusting unit which changes the incident position of the incident light from said semiconductor laser into said interference optical filter continuously in a specified direction;

wherein said interference optical filter is composed by laminating low refractive index films and high refractive index films having optical thicknesses of $\lambda/4$ for transmission wavelength $\lambda$ alternately in multiple layers on a substrate, and the optical thicknesses are changed continuously so that the wavelength $\lambda$ change continuously in the specified direction at least in the wavelength variable range of said semiconductor laser; and electronic circuits composing said output ratio calculator and wavelength calculator and said incident position adjusting unit and optical module are accommodated in a same case.

8. A laser light source apparatus of claim 7, further comprising:

a temperature detecting element disposed near said interference optical filter, for detecting the ambient temperature of said interference optical filter, and a temperature compensator which compensates for characteristic changes due to temperature changes of the interference optical filter on the basis of the output of the temperature detecting element by correcting the target value of the output ratio issued from said output ratio calculator.

9. A laser light source apparatus according to claim 7, wherein said output ratio calculator comprises:

an adder for calculating the sum of the output signals of said first and second photo detectors;

a subtracter for calculating the difference of the output signals of said first and second photo detectors; and a divider for calculating the output ratio of said adder and said subtracter.

10. A laser light source apparatus according to claim 7, wherein said wavelength controller comprises:

an error detector for detecting the difference of the output ratio calculated by said output ratio calculator and the specified reference value;

a reference value adjuster for setting reference value in said error detector; and a light source driver for controlling the emission wavelength of said laser light source in a manner that the error detected by said error detector becomes zero.

11. A laser light source apparatus according to claim 10, wherein said reference value adjuster generates a reference value in a specified range.

* * * * *